United States Patent
Theriault

[19]

[11] Patent Number: 5,931,626
[45] Date of Patent: Aug. 3, 1999

[54] ROBOT MOUNTING DE-COUPLING TECHNIQUE

[75] Inventor: Victor J. Theriault, Beverly, Mass.

[73] Assignee: Brooks Automation Inc., Chelmsford, Mass.

[21] Appl. No.: 09/008,615

[22] Filed: Jan. 16, 1998

[51] Int. Cl.⁶ .................................................. B65G 65/02
[52] U.S. Cl. .............................. 414/217; 29/434; 29/450; 414/939
[58] Field of Search ..................................... 414/217, 222, 414/937, 939, 800; 204/298.25, 298.35; 118/719; 29/434, 450, 722

[56] References Cited

U.S. PATENT DOCUMENTS

| | | | |
|---|---|---|---|
| 4,951,601 | 8/1990 | Maydan et al. | 118/719 |
| 5,180,276 | 1/1993 | Hendrickson | 414/752 |
| 5,234,303 | 8/1993 | Koyano | 414/939 X |
| 5,270,600 | 12/1993 | Hashimoto | 310/75 |
| 5,577,879 | 11/1996 | Eastman et al. | 414/744.5 |
| 5,697,749 | 12/1997 | Iwabuchi et al. | 414/939 X |
| 5,730,801 | 3/1998 | Tepman et al. | 414/939 X |
| 5,746,562 | 5/1998 | Hasegawa et al. | 414/217 |
| 5,752,796 | 5/1998 | Muka | 414/939 X |
| 5,788,447 | 8/1998 | Yonemitsu et al. | 414/939 X |

FOREIGN PATENT DOCUMENTS

| | | |
|---|---|---|
| 94/23911 | 10/1994 | WIPO . |
| 97/26117 | 7/1997 | WIPO . |

Primary Examiner—David A. Bucci
Attorney, Agent, or Firm—Perman & Green, LLP

[57] ABSTRACT

A substrate processing apparatus includes a support frame, a substrate transport chamber connected to the support frame, and a substrate transfer robot located at least partially in the substrate transport chamber. The support frame includes a first section directly connected to the substrate transport chamber, and a second section directly connected to the substrate transfer robot. The second section is separate from the first section and includes mounting arms having leveling points. The leveling points support the substrate transfer robot and align the robot relative to the transport chamber. Further, the substrate transport chamber includes a wall having an aperture. The substrate transfer robot is located in the aperture. A flexible coupling flange is mounted between the wall of the substrate transport chamber and the substrate transfer robot. The flexible coupling flange seals a portion of the aperture between the wall and the substrate transfer robot.

11 Claims, 3 Drawing Sheets

ROBOT MOUNTING DE-COUPLING TECHNIQUE

BACKGROUND OF THE INVENTION

1. Field of the Invention

The present invention relates to substrate processing apparatus and, more particularly, to the mounting of a substrate transfer robot to a transport chamber.

2. Prior Art

U.S. Pat. No. 4,951,601 discloses a substrate processing apparatus with multiple processing chambers and a substrate transport apparatus. U.S. Pat. No. 5,270,600 discloses a coaxial drive shaft assembly of a substrate transport apparatus.

In many substrate processing applications a substrate transport apparatus includes a substrate transport robot which is mounted to a central, transport chamber. Typically, the transport robot has an arm assembly which operates in the transport chamber to transfer a substrate to and from adjacent chambers. Prior to operation, the transport robot is taught the locations of the adjacent chambers in which the substrate is to be transported for processing. It can be appreciated that teaching the precise location of each of the chambers prevents an undesired collision of the substrate with the walls of the chambers while the substrate is being transported. A collision may damage the substrate.

Teaching the location of each of the adjacent chambers is often performed at atmospheric pressure. During normal non-teaching operation, however, the transport chamber is usually evacuated to a desired operating vacuum pressure. Mechanical deflections may occur in the transport chamber as a result of this evacuation. The mechanical deflections may result in a significant variation in the location of the transport robot which is mounted to the transport chamber. As the location of the transport robot varies, the location of each of the processing chambers relative to those taught to the transfer robot prior to operation varies. Variations caused by mechanical deflection are particularly significant as the size of transport chambers increase to accommodate larger substrates.

Prior art solutions to the mechanical deflections and resulting variations in the locations of the transport robot and processing chambers included strengthening the transport chamber with structural supporting members, for example, steel support beams. While the structural supporting members may be effective in preventing the mechanical deflections, the additional weight and cost of the additional material typically violate design constraints. Also, the handling and the assembly of the chambers with the structural supporting members becomes more complicated.

It is an object of the present invention to provide a method for mounting and aligning the substrate transport robot to the transport chamber which minimizes the effects of chamber deflection and maintains the accuracy of the location of the mounted transport robot during operation.

SUMMARY OF THE INVENTION

The foregoing and other problems are overcome by methods and apparatus in accordance with embodiments of this invention.

In accordance with one embodiment of the present invention, a substrate processing apparatus includes a support frame, a substrate transport chamber connected to the support frame, and a substrate transfer robot located at least partially in the substrate transport chamber. The support frame includes a first section directly connected to the substrate transport chamber, and a second section directly connected to the substrate transfer robot. The second section is separate from the first section. The second section of the support frame includes mounting arms having leveling points. The leveling points support the substrate transfer robot and align the robot relative to the transport chamber In accordance with another embodiment of the present invention, the substrate transport chamber includes a wall having an aperture. For example, the wall of the substrate transport chamber may be located at a base, or a floor, of the substrate transport chamber. The substrate transfer robot is located in the aperture. A flexible coupling flange is mounted between the wall of the substrate transport chamber and the substrate transfer robot. The coupling flange seals a portion of the aperture between the wall and the substrate transfer robot. The flexible coupling flange is of suitable material and size such that, when the transport chamber is evacuated to a desired operating vacuum pressure, the portion of the aperture between the wall and the substrate transfer robot remains sealed.

In accordance with one method of the present invention, a method is provided for mounting a substrate transfer robot to a substrate transport chamber. The method includes the steps of: connecting the substrate transport chamber to a support; mounting the substrate transfer robot directly to the support, the substrate transfer robot being located in an aperture through a wall of the substrate transport chamber; and connecting a flexible coupling flange between the substrate transport chamber and the substrate transfer robot such that the coupling flange seals a portion of the aperture between the wall of the substrate transport chamber and the substrate transport robot.

BRIEF DESCRIPTION OF THE DRAWINGS

The foregoing aspects and other features of the invention are explained in the following description, taken in connection with the accompanying drawings, wherein.

Identically labelled elements appearing in different ones of the above described figures refer to the same elements, but may not be referenced in the description for all figures.

DETAILED DESCRIPTION OF THE INVENTION

Figure 1:
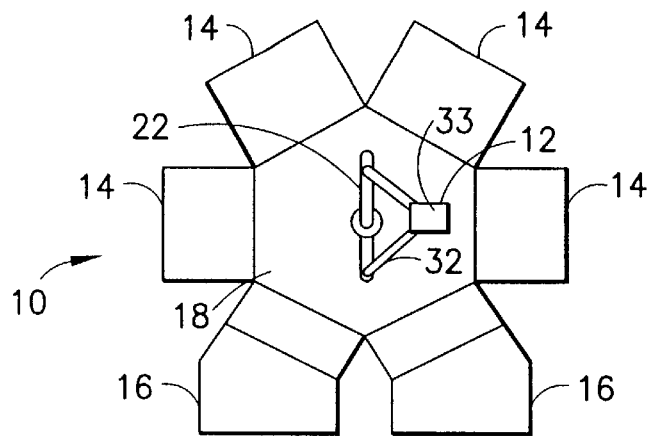
FIG. 1 is a schematic top plan view of a substrate processing apparatus having a substrate transport apparatus incorporating features of the present invention.

FIG. 1 shows a schematic top plan view of a substrate processing apparatus 10 incorporating features of the present invention. Although the present invention will be described with reference to the embodiments shown in the drawings, it should be understood that the present invention may be embodied in many forms of alternative embodiments. In addition, any suitable size, shape or type of materials or elements could be used.

The substrate processing apparatus 10 includes a substrate transport apparatus 12, multiple processing chambers 14, substrate cassette elevators or load locks 16 and a central, transport chamber 18. The transport apparatus 12 is located, at least partially, in the transport chamber 18 and is adapted to transport planar substrates, such as semiconductor wafers or flat panel display substrates, between and/or among the processing chambers 14 and the elevators 16. The transport apparatus 12 generally comprises a substrate transport robot 32 having a driver section (not shown) and a movable arm section 22. PCT Patent Publication No. WO 94/23911 discloses a similar transport apparatus which is hereby incorporated by reference in its entirety. However, in alternate embodiments, any suitable type of transport apparatus could be used. The processing chambers 14 and elevators/ load locks 16 are well known in the art and, thus, are not described in further detail.

Movement of the substrate transport robot 32 (see FIG. 3) is controlled by a controller 26 to move end effectors 33 of the movable arm section 22 through doorways of the processing chambers 14 and elevators 16. The precise locations of each of the processing chambers 14, elevators 16, and their doorways are taught to the substrate transport robot 32 to prevent an undesired collision of the substrate with any walls while the substrate is being transported into and out of the processing chambers 14 and elevators 16. In alternate embodiments, the transport apparatus 12 could be used in any suitable type of substrate processing apparatus.

As stated above, the controller 26 is taught the locations of each of the processing chambers 14, elevators 16, and their respective doorways. The expression "the controller 26 is taught" refers to a process in which a processing means ($\mu$p) 28 of the controller 26 is provided with precise linear dimensions of the transport chamber 18, the processing chambers 14, the elevators 16, and the doorways relative to the location of the substrate transport robot 32. The linear dimensions define the locations of walls of the transport chamber 18, the processing chambers 14, and the elevators 16. From the linear dimensions the controller 26 determines a path in which the substrates may be transported into and out of the processing chambers 14 and elevators 16 during a normal, non-teaching operating mode.

The process for providing the linear dimensions to the processing means ($\mu$p) 28 of the controller 26 may be, for example, a process in which the end effectors 33 of the movable arm section 22 of the substrate transport robot 36 are manually manipulated into and out of the processing chambers 14 and elevators 16. During this manual manipulation, the processing means 28 records the displacement of the end effectors. The recorded displacement could then be "played back" to realize the movement into and out of the processing chambers 14 and elevators 16 during the normal, non-teaching operating mode.

Figure 2:
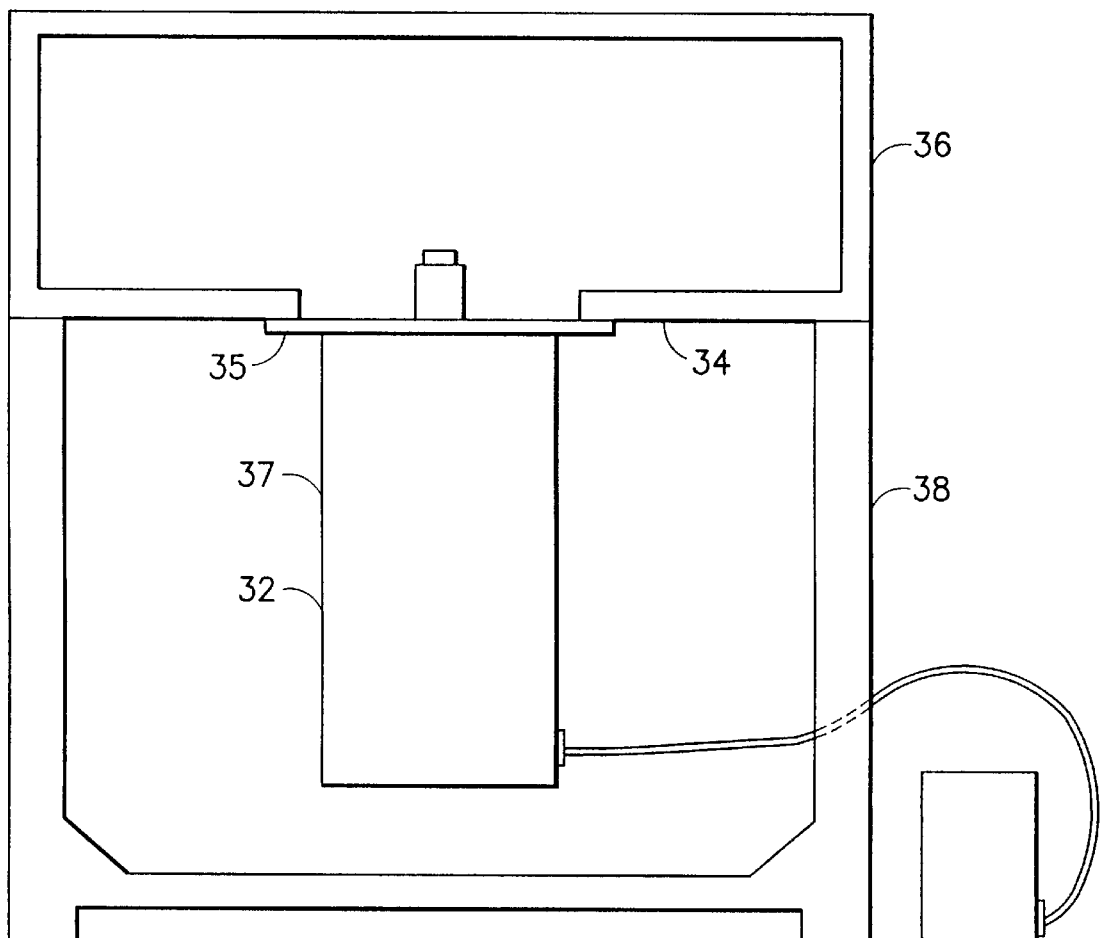
FIG. 2 is a schematic partial cross-sectional side view of a conventional method of mounting a substrate transport robot to a transport chamber.

Referring to FIG. 2, in a conventional substrate processing apparatus a substrate transport robot 32 is fixedly mounted to a wall 34 of a transfer chamber 36 such that the substrate transport robot 32 is located, at least partially, in the transport chamber 36. The substrate transport robot 32 has a flange 35. The flange 35 is provided to directly stationarily attach the driver section 37 to the bottom wall 34 of the transfer chamber 36. A support frame 38 is provided to support the transport chamber 36. Thus, the substrate transport robot 32 is only indirectly mounted to the support frame 38 through the bottom wall 34 of the chamber 36. The controller 26 is electrically coupled to the substrate transport robot 32 and directs the substrate transport robot 32 to transfer a substrate to and from adjacent processing chambers (not shown but substantially similar to those illustrated in FIG. 1) and the transport chamber 36. Prior to operation, the controller 26 is taught the locations of the adjacent processing chambers.

As in the substrate processing apparatus illustrated in FIG. 1, the precise location of each of the processing chambers are taught to the controller 26 to prevent an undesired collision of the substrate with the walls of the processing chambers while the substrate is being transported. This is particularly important because a collision may damage the substrate. The teaching of the location of each of the processing chambers is typically performed at atmospheric pressure. In a normal, non-teaching operating mode, however, the transport chamber 36 is evacuated to a desired operating vacuum pressure. Mechanical deflections may occur in the transport chamber 36 as a result of this evacuation. In particular, the mechanical deflections may occur in the bottom wall 34 of the transport chamber 36 which supports the transport robot 32. As a result of the mechanical deflections in the wall 34, a significant variation in the location of the transport robot 32, in relation to the location of each of the doorways, may occur. It can be appreciated that any variation in the location of the substrate transport robot 32 and the processing chambers may result in the undesirable collision as described above.

Figure 3:
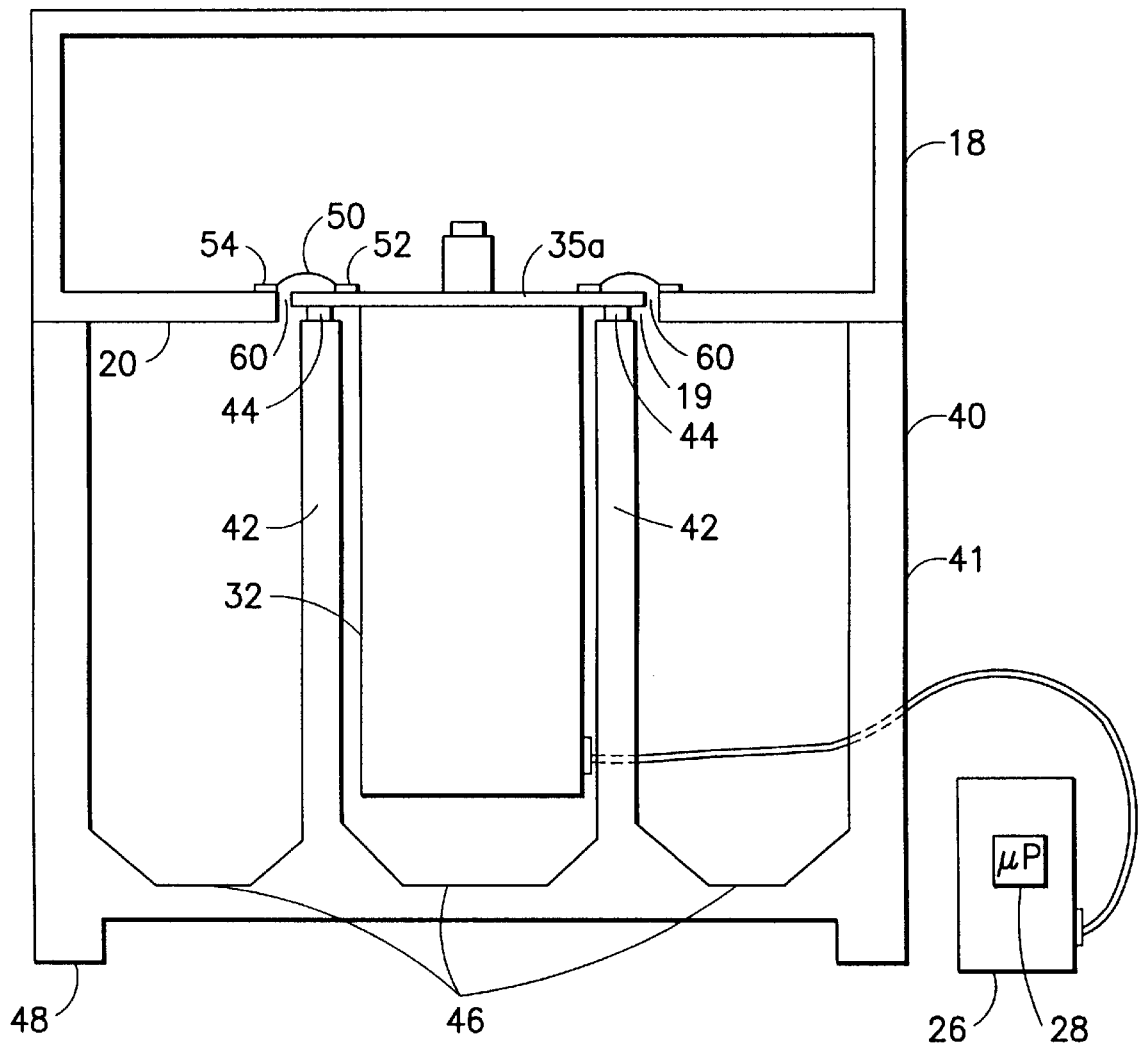
FIG. 3 is a schematic partial cross-sectional side view of a first embodiment of a method of mounting a substrate transport robot to a transport chamber in accordance with the present invention.

Referring now to FIGS. 1 and 3, the present invention comprises a support frame 40 for supporting the transport chamber 18. The support frame 40 includes mounting arms 42. The mounting arms 42 independently support the substrate transport robot 32. That is, while an outer portion 41 of the support frame 40 supports the transport chamber 18, an inner portion of the support frame 40, i.e. the mounting arms 42, separately supports the substrate transport robot 32. The support frame 40 further includes connecting portions 46 which interconnect the inner portion 42 and the outer portion 41 of the support frame 40. In an alternative embodiment, the support frame 40 also includes additional connecting portions which interconnect the inner and outer portions of the support frame 40 to provide added structural support to the inner portion. In another embodiment, the inner portion of the support frame 40 could comprise a cylindrical member, a square member, or any other suitable configuration in which the substrate transport robot 32 is independently supported.

As shown in the embodiment of FIG. 3, the support frame 40 further includes legs 48. For the sake of clarity, FIG. 3 shows the robot 32 without the moveable arm assembly 22 attached. The legs 48 are of suitable dimensions for supporting the support frame 40 on a floor. In an alternate embodiment, the legs 48 are of suitable dimensions to support the support frame 40 on a structure other than the floor, for example, a chamber. In another embodiment, the legs 48 include leveling members which permit adjustment to precisely align the supporting frame 40 and the substrate transport robot 32 supported by the mounting arms 42 such that the substrate transfer robot 32 transfers the substrates into and out of the processing chambers 14 and elevators 16 along a level plane.

The transport chamber 18 includes a wall 20 having an inner portion which has an aperture 19. The substrate transport robot 32 is shown disposed in the aperture 19 such that the substrate transport robot 32 may transport the substrates between the processing chambers 14 and the elevators 16 connected to the transport chamber 18. The mounting arms 42 support the flange 35a of the transport robot 32 in the aperture 19. The mounting arms 42 have leveling points 44 suitable for precise alignment of the location of the transport robot 32 with the processing chambers 14 and elevators 16. Preferably, the leveling points 44 also permit the alignment of the transport robot 32 to achieve the level transfer plane discussed above.

Also shown in FIG. 3 is a flexible coupling flange 50. The flexible coupling flange 50 is mounted to the wall 20 of the transport chamber 18 and to the substrate transport robot 32. The flexible coupling flange 50 is mounted to seal a gap 60 between the wall 20 of the transport chamber 18 and the transport robot 32. The flexible coupling flange 50 is made of resilient material so that, as the transport chamber 18 is evacuated in the normal, non-teaching operating mode, the gap 60 between the wall 20 and the transport robot 32 remains sealed. Preferably, the flexible coupling flange 50 includes a ring-shaped member having an inner side 52 and an outer side 54. The inner side 52 and the outer side 54 are suitably configured to facilitate mounting of the flexible coupling flange 50 to the wall 20 and the substrate transport robot 32. In one embodiment, the flexible coupling flange 50 is removably mounted to the wall 20 and/or the substrate transport robot 32 at the inner side 52 and outer side 54, respectively. The removable mounting permits access to the substrate transport robot 32, for example, so that maintenance operations may be performed on the substrate transport robot 32.

Figure 4:
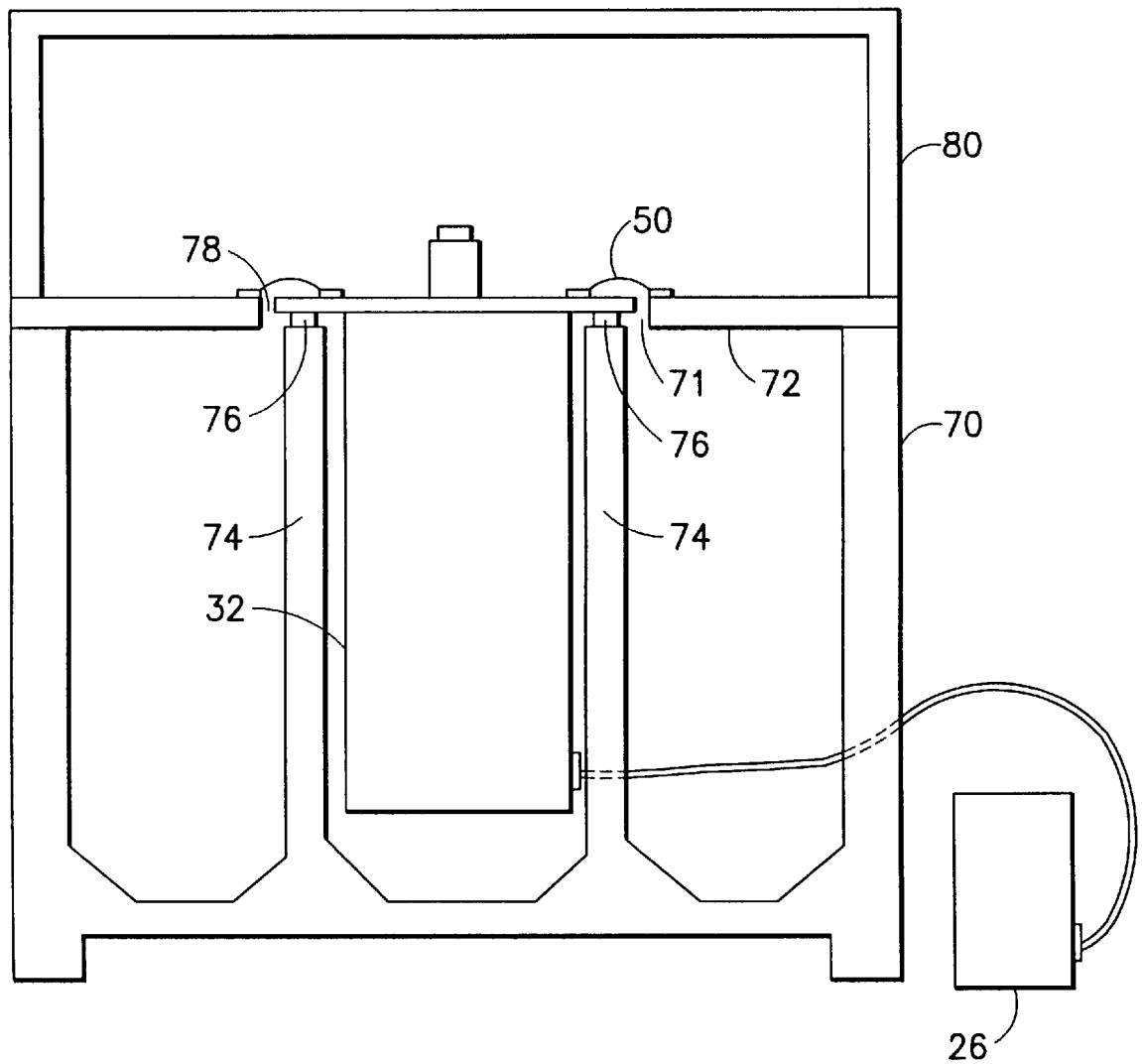
FIG. 4 is a schematic partial cross-sectional side view of a second embodiment of a method of mounting a substrate transport robot to a transport chamber in accordance with the present invention.

In another embodiment, shown in FIG. 4 and substantially similar to the embodiment of FIG. 3, a support frame 70 includes a mounting wall 72. A transport chamber 80 is fixedly mounted to the mounting wall 72 such that the support frame 70 supports the transport chamber 80. The mounting wall 72 has an inner region having an aperture 71. The substrate transport robot 32 is disposed within the aperture 71 and is independently supported by mounting arms 74 of the support frame 70. As in the support frame 40, the mounting arms 74 of support frame 70 have leveling points 76 suitable for precise alignment of the location of the transport robot 32 with the processing chambers (not shown) which are substantially similar to the processing chambers 14 of FIGS. 1 and 3. Also, the flexible coupling flange 50 is mounted to seal a gap 78 between the mounting wall 72 of the support frame 70 and the transport robot 32. In this embodiment, as in the embodiment of FIG. 3, the flexible coupling flange 50 is made of a resilient material so that as the transport chamber 80 is evacuated during the normal, non-teaching operating mode, the gap 78 between the mounting wall 72 and the substrate transport robot 32 remains sealed.

It can be appreciated that the mounting methods of the present invention permits the maintenance of accurate mounting locations for the substrate transport robot 32 within the transport chambers 18 and 80. As described above, in each of the embodiments illustrated in FIGS. 3 and 4, the substrate transport robot 32 is directly stationarily mounted to the inner portions 42 and 74 of the support frames 40 and 70. The substrate transport robot 32 is disposed within the apertures 19 and 71, and the flexible coupling flange 50 is mounted to the substrate transport robot 32 and the walls 20 and 72 to seal the gap 60 and 78 between the walls 20 and 72 and the substrate transport robot 32.

As in the prior art, the substrate transport robot 32 is taught the locations of the processing chambers at atmospheric pressure. In the normal, non-teaching operating mode, the bottom wall 20 of the transport chamber 18 (FIG. 3) or the mounting wall 72 of the transport chamber 80 (FIG. 4) may deflect as the transport chambers 18 and 80 are evacuated. In accordance with the present invention, the deflection of the walls 20 and 72 does not result in a deflection of the substrate transport robot 32 relative to the support frames 40 and 70. Therefore, there is no significant deflection of the substrate transport robot 32 in relation to the doorways of the chambers 14 and 16. The flexible coupling flange 50 mounted to the substrate transport robot 32 and the walls 20 and 72 compensates for the relative movement of the walls 20 and 72 due to the deflection. Additionally, the flexible coupling flange 50 maintains the seal over the gaps 60 and 78 while the transport chambers 18 and 80 are evacuated.

Thus, with the mounting methods and apparatus of the present invention, the perceived deficiencies of the prior art for minimizing the effects of the deflections are avoided.

While the invention has been particularly shown and described with respect to preferred embodiments thereof, it will be understood by those skilled in the art that changes in form and details may be made therein without departing from the scope and spirit of the invention.

What is claimed is:

1. A substrate processing apparatus comprising a support frame, a substrate transport chamber connected to said support frame, and a substrate transfer robot located at least partially in said substrate transport chamber, wherein said support frame comprises:

a first section directly connected to said substrate transport chamber;

a second section directly connected to said substrate transfer robot separate from said first section, and a base connecting said second section to said first section, said base having legs to support the substrate transport chamber and the support frame, wherein said first and second sections are directly rigidly connected to each other by said base.

2. A substrate processing apparatus as set forth in claim 1, wherein said substrate transport chamber includes a wall having an outer region and an inner region having an aperture, said first section of said support frame being connected to said base and directly connected to said outer region of said wall, said second section of said support frame being connected to said base and supporting said substrate transfer robot in said aperture of said inner region of said wall.

3. A substrate processing apparatus as set forth in claim 1, wherein said second section of said support frame further comprising mounting arms having leveling points for supporting said substrate transfer robot and for aligning said substrate transfer robot relative to said substrate transport chamber.

4. A substrate processing apparatus as set forth in claim 1, wherein said substrate transport chamber includes a wall having an aperture, said substrate transfer robot is located in said aperture, and wherein said second section of said support frame further comprising mounting arms located in proximity to said aperture and supporting said substrate transfer robot therein.

5. A substrate processing apparatus as set forth in claim 1, wherein said second section of said support frame further comprising:

a mounting wall having an aperture, said mounting wall directly connected to said substrate transport chamber, wherein said substrate transfer robot is located in said aperture; and mounting arms located in proximity to said aperture and supporting said substrate transfer robot therein.

6. A substrate processing apparatus as set forth in claim 1 further comprising:

a flexible coupling flange mounted between said substrate transport chamber and said substrate transfer robot such that said flexible coupling flange seals a gap between said substrate transport chamber and said substrate transfer robot.

7. A substrate processing apparatus as set forth in claim 6, wherein when said substrate transport chamber is evacuated to a desired operating vacuum pressure said substrate transport chamber deflects relative to said substrate transport robot and said flexible coupling flange maintains the seal at said gap between said substrate transport chamber and said substrate transfer robot.

8. In a substrate processing apparatus comprising a support frame, a substrate transport chamber connected to said support frame, said substrate transport chamber including a wall having an aperture, and a substrate transfer robot extending through said aperture, wherein the improvement comprises:

a flexible coupling flange mounted between said wall of said substrate transport chamber and said substrate transfer robot such that said coupling flange seals a portion of said aperture between said wall and said substrate transfer robot, wherein said support frame comprises a first section directly rigidly connected to said substrate transport chamber and a second section directly rigidly connected to said substrate transfer robot, and wherein said first and second sections are directly connected to each other by a base having legs for supporting the support frame on a floor.

9. A substrate processing apparatus as in claim 8, wherein said flexible coupling flange comprises a resilient, ring-shaped member having an inner side and an outer side, said inner side being connected to said substrate transfer robot and said outer side being connected to said wall of said substrate transfer chamber.

10. A substrate processing apparatus as in claim 8, wherein said substrate transport chamber is a vacuum chamber and said flexible coupling flange further comprises a resilient, ring-shaped member suitably sized such that, when said vacuum chamber is evacuated to a desired operating vacuum pressure, said portion of said aperture between said wall and said substrate transfer robot remains sealed.

11. A substrate processing apparatus as in claim 8, wherein said flexible coupling flange comprises a resilient, ring-shaped member removably mounted between said wall of said substrate transport chamber and said substrate transfer robot.

* * * * *